US012796229B2

(12) United States Patent
Yu et al.

(10) Patent No.: US 12,796,229 B2
(45) Date of Patent: Nov. 10, 2026

(54) DISPLAY PANEL AND DISPLAY DEVICE

(71) Applicant: BOE Technology Group Co., Ltd., Beijing (CN)

(72) Inventors: Donghui Yu, Beijing (CN); Cheng Xu, Beijing (CN); Dandan Zhou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 432 days.

(21) Appl. No.: 18/288,914

(22) PCT Filed: Feb. 9, 2023

(86) PCT No.: PCT/CN2023/075168
§ 371 (c)(1),
(2) Date: Oct. 30, 2023

(87) PCT Pub. No.: WO2024/164226
PCT Pub. Date: Aug. 15, 2024

(65) Prior Publication Data
US 2025/0081735 A1 Mar. 6, 2025

(51) Int. Cl.
*H01L 29/205* (2006.01)
*H01L 33/00* (2010.01)
(Continued)

(52) U.S. Cl.
CPC ......... *H10K 59/122* (2023.02); *H10K 59/879* (2023.02)

(58) Field of Classification Search
CPC .... H10K 59/122; H10K 59/879; H10K 59/12; H10K 50/858; H10K 50/11;
(Continued)

(56) References Cited

U.S. PATENT DOCUMENTS 9,293,735 B2 * 3/2016 Choi ...................... H10K 59/38
2004/0032637 A1 * 2/2004 Imamura ............... G02F 1/1345
359/245
(Continued)

FOREIGN PATENT DOCUMENTS

CN 103972262 A 8/2014
CN 104282715 A 1/2015
(Continued)

*Primary Examiner* — Niki H Nguyen
(74) *Attorney, Agent, or Firm* — Banner & Witcoff, Ltd.

(57) ABSTRACT

Provided are a display panel and a display device. The display panel includes: a base substrate, including a plurality of light-emitting regions and a non-light-emitting region located between adjacent light-emitting regions; a pixel-defining layer, located on the base substrate and having a main body part and a plurality of openings defined by the main body part, each of the plurality openings being configured to define at least one of the plurality of light-emitting
(Continued)

regions; a first structural layer at least located in one light-emitting region; a second structural layer at least located in the non-light-emitting region; the first structural layer has a first refractive index, the second structural layer has a second refractive index, and the first refractive index is greater than the second refractive index.

20 Claims, 8 Drawing Sheets

(51) Int. Cl.
*H10K 59/122* (2023.01)
*H10K 59/80* (2023.01)

(58) Field of Classification Search
CPC .. H10K 59/124; H10K 50/84; H10K 59/1213; H10K 59/50; H10K 59/353; H10K 50/19; H10K 59/10; H10K 2102/302; H10K 59/126; H10K 59/351; H10K 50/13; H10K 59/60; H10K 59/352; H10K 2102/311; H10K 50/814; H10K 59/80516; H10K 2102/3031; H10K 50/10; H10K 59/17; H10K 2102/301; H10K 2102/20; H10K 30/88; H10K 2102/321; H10K 59/127; H10K 59/128; H10K 59/176; H10K 59/65; H01L 2924/12041; H01L 2924/12044
See application file for complete search history.

(56) References Cited

U.S. PATENT DOCUMENTS

| | | | | |
|---|---|---|---|---|
| 2007/0114519 | A1* | 5/2007 | Hayashi | H10K 59/8722 257/40 |
| 2015/0008399 | A1* | 1/2015 | Choi | H10K 59/38 257/40 |
| 2021/0328193 | A1* | 10/2021 | Gong | H10K 59/122 |
| 2023/0180585 | A1* | 6/2023 | Xia | H10K 59/879 257/40 |
| 2024/0040912 | A1 | 2/2024 | Jiang et al. | |

FOREIGN PATENT DOCUMENTS

| | | | |
|---|---|---|---|
| CN | 107195540 | A | 9/2017 |
| CN | 111276515 | A | 6/2020 |
| CN | 113054136 | A | 6/2021 |
| CN | 113629209 | A | 11/2021 |
| CN | 114203934 | A | 3/2022 |
| CN | 114284454 | A | 4/2022 |
| CN | 114639794 | A | 6/2022 |
| CN | 115377175 | A * | 11/2022 |

* cited by examiner

DISPLAY PANEL AND DISPLAY DEVICE

The application is a U.S. National Phase Entry of International Application No. PCT/CN2023/075168 filed Feb. 9, 2023, designating the United States of America. The present application claims priority to and the benefit of the above-identified application and the above-identified application is incorporated by reference herein in its entirety.

TECHNICAL FIELD

Embodiments of the present disclosure relate to a display panel and a display device.

BACKGROUND

Display panels, such as display panels of organic light-emitting diodes (OLED) or quantum dot light-emitting diodes (QLED), have been increasingly widely used in various display devices such as mobile phones, tablets and computers, and televisions owing to their self-luminous characteristics.

SUMMARY

Embodiments of the present disclosure provide a display panel and a display device.

Embodiments of the present disclosure provide a display panel, including: a base substrate, including a plurality of light-emitting regions and a non-light-emitting region located between adjacent ones of the plurality of light-emitting regions; a pixel-defining layer, located on the base substrate and having a main body part and a plurality of openings defined by the main body part, each of the plurality openings being configured to define at least one of the plurality of light-emitting regions; a first structural layer at least located in one of the plurality of light-emitting regions; a second structural layer at least located in the non-light-emitting region; the first structural layer has a first refractive index, the second structural layer has a second refractive index, and the first refractive index is greater than the second refractive index.

For example, the second structural layer is located on the main body part, and the first structural layer is filled in a space defined by the second structural layer.

For example, an orthographic projection of the second structural layer on the base substrate falls within an orthographic projection of the main body part on the base substrate.

For example, the first structural layer includes a base layer and filling particles located in the base layer, a refractive index of the filling particles is greater than a refractive index of the base layer.

For example, a material of the base layer includes an acrylic material, and a material of the second structural layer includes an acrylic material.

For example, a particle size of the filling particles is at the nanometer level.

For example, a surface of the first structural layer facing away from the base substrate has a concave-convex structure.

For example, the display panel further includes an adhesive layer, the adhesive layer covers the first structural layer and covers the second structural layer.

For example, the adhesive layer is in contact with the first structural layer.

For example, an area of the first structural layer is not less than an area of the plurality of light-emitting regions, and a side surface of the first structural layer is in contact with a side surface of the second structural layer.

For example, the display panel further includes a cover plate, the cover plate is in contact with the first structural layer and in contact with the second structural layer.

For example, the main body part has a groove, and the second structural layer is filled in the groove and protrudes from the main body part.

For example, the display panel further includes an adhesive layer and a cover plate, the cover plate is bonded to the base substrate through the adhesive layer, and a refractive index of the adhesive layer is greater than the second refractive index.

For example, a ratio of the maximum dimension of a portion of the second structural layer protruding from the main body part to the maximum thickness of the main body part is greater than or equal to 1:2 and less than or equal to 3:2.

For example, the first structural layer is located in the plurality of light-emitting regions and located in the non-light-emitting region, the second structural layer is located in the plurality of light-emitting regions and located in the non-light-emitting region, and the first structural layer is closer to the base substrate than the second structural layer.

For example, the display panel further includes a lens layer, the lens layer is located between the first structural layer and the second structural layer.

For example, the lens layer includes a plurality of lens groups, each of the plurality of lens groups includes a plurality of lens units, and an orthographic projection of the plurality of lens units on the base substrate overlap an orthographic projection of the opening on the base substrate.

For example, a thickness of the first structural layer is greater than 5 μm.

For example, a thickness of the first structural layer is less than or equal to 20 μm.

For example, a side surface of the main body part has a step shape, and the second structural layer covers the side surface and a top surface of the main body part.

For example, the main body part has a first main body and a second main body, a step is provided between the first main body and the second main body, the first main body is closer to the base substrate than the second main body, and the first structural layer is at least filled in a space defined by the second main body.

For example, the display panel further includes an intermediate film layer located between the first structural layer and the second structural layer, a refractive index of the intermediate film layer is greater than the second refractive index and greater than or equal to the first refractive index.

Embodiments of the present disclosure further provide a display device, including any one of the display panels as described above.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not construed as any limitation to the present disclosure.

DETAILED DESCRIPTION

Figure 1:
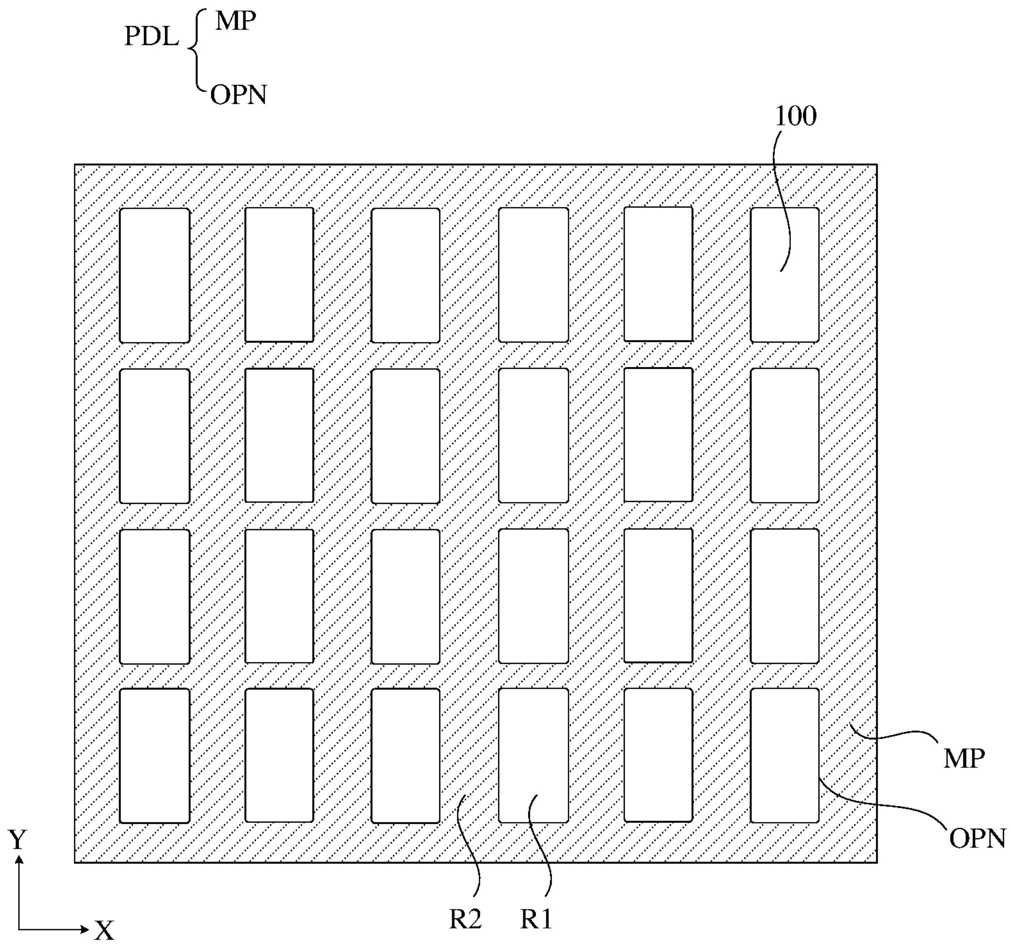
FIG. 1 is a plan view of a display panel provided by an embodiment of the present disclosure.

For more clear understanding of the objectives, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly.

Enabling display panels to have high efficiency has always been the goal. At present, improvement is mostly made by optimizing the material and structure of the light-emitting functional layer. However, as the efficiency becomes higher and higher, there is less and less room for the optimization of materials and structures. Therefore, how to further improve efficiency has become an urgent problem to be solved.

Medium-sized and large-sized display panels with light-emitting elements that emit white light often achieve full-color display by means of white light passing through a color filter cover. However, during the display process, the problem of pixel crosstalk may easily occur due to the influence of gap and alignment, thus resulting in abnormal display color. Therefore, how to reduce crosstalk becomes a problem that needs to be solved.

A general light-emitting functional layer improves optical efficiency by updates of the structure and material thereof, but the cost is getting higher and higher and development is becoming more and more difficult. How to improve optical performance on the basis of a common architecture, solve related crosstalk problems, and improve display quality have become urgent problems that need to be solved.

In the embodiments of the present disclosure, through structural design, light extraction efficiency is effectively enhanced and pixel crosstalk problems are simultaneously improved without changing the structures of the light-emitting functional layer and the backplane. Product performance is improved and product competitiveness is enhanced.

In the embodiments of the present disclosure, a light extraction structure of a light-emitting element is designed by performing structural design and material matching on an encapsulation structure, thus easily enhancing light extraction efficiency and improving crosstalk problems.

FIG. 1 is a plan view of a display panel provided by an embodiment of the present disclosure. As illustrated in FIG. 1, the display panel includes a plurality of sub-pixels 100. FIG. 1 is described by taking as an example that the plurality of sub-pixels 100 are arranged in an array. Of course, the arrangement of the plurality of sub-pixels 100 is not limited to that illustrated in the figure. The shapes and sizes of the sub-pixels 100 are also not limited to those illustrated in the figure. For example, the sub-pixels 100 can emit red, green, blue or white light as required. Of course, light of other colors can also be emitted as required. FIG. 1 illustrates the sub-pixels 100 by means of light-emitting regions of the sub-pixels 100. The sub-pixel 100 illustrated in FIG. 1 is a light-emitting region of a light-emitting element.

Figure 2:
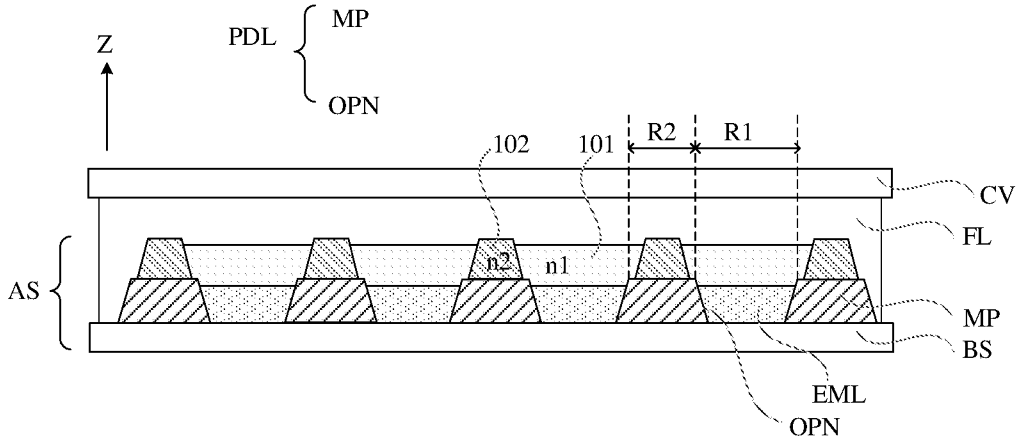
FIG. 2 is a cross-sectional view of a display panel provided by an embodiment of the present disclosure.

FIG. 2 is a cross-sectional view of a display panel provided by an embodiment of the present disclosure. As illustrated in FIG. 1 and FIG. 2, the display panel includes a pixel-defining layer PDL. As illustrated in FIG. 1, the pixel-defining layer PDL has a main body part MP and a plurality of openings OPN defined by the main body part MP, each of the openings OPN is configured to define a light-emitting region R1. As illustrated in FIG. 1 and FIG. 2, each of the openings OPN is configured to define the light-emitting region R1 of the sub-pixel 100. For example, each of the openings OPN is configured to define at least one of the plurality of light-emitting regions R1 of the sub-pixels 100.

FIG. 1 and FIG. 2 also illustrate the non-light-emitting region R2. The non-light-emitting region R2 is located between adjacent light-emitting regions R1. As illustrated in FIG. 1 and FIG. 2, the light-emitting region R1 corresponds to the opening OPN of the pixel-defining layer PDL, and the non-light-emitting region R2 corresponds to an area of the pixel-defining layer PDL other than the opening OPN, for example, corresponding to the main body part MP, but not limited thereto. For example, the non-light emitting region R2 corresponds to the top surface of the main body part MP, and the light-emitting region R1 corresponds to the top surface of the opening OPN, but is not limited thereto. For example, both the light-emitting region R1 and the non-light-emitting region R2 in the embodiments of the present disclosure are defined by the pixel-defining layer PDL.

As illustrated in FIG. 1 and FIG. 2, the non-light-emitting region R2 and the plurality of light-emitting regions R1 together constitute an image display area.

In some figures of the embodiments of the present disclosure, the plan views illustrate the direction X and the direction Y, and the cross-sectional views illustrate the direction Z. Both the direction X and the direction Y are directions parallel to the main surface of the base substrate BS. The direction Z is a direction perpendicular to the main surface of the base substrate BS. For example, the direction X intersects with the direction Y. The embodiments of the present disclosure are described by taking as an example that the direction X and the direction Y are perpendicular to each other. For example, the main surface of the base substrate BS is the surface of the base substrate BS used for manufacturing various elements. The upper surface of the base substrate BS in the cross-sectional view is the main surface of the base substrate BS. The direction Z is perpendicular to the direction X and is perpendicular to the direction Y.

As illustrated in FIG. 2, the display panel includes: a base substrate BS and a pixel-defining layer PDL located on the base substrate BS.

As illustrated in FIG. 2, the display panel further includes a first structural layer 101, and the first structural layer 101 is at least located in one light-emitting region R1. Furthermore, for example, the first structural layer 101 is at least located in a plurality of light-emitting regions R1.

As illustrated in FIG. 2, the display panel further includes a second structural layer 102 located in the non-light-emitting region R2.

As illustrated in FIG. 2, the first structural layer 101 has a first refractive index n1, the second structural layer 102 has a second refractive index n2, and the first refractive index n1 is greater than the second refractive index n2.

FIG. 2 illustrates the light-emitting functional layer EML, and the first electrode and the second electrode provided on both sides of the light-emitting functional layer EML are omitted.

In the display panel provided by an embodiment of the present disclosure, when the light emitted by the light-emitting element is incident on the first structural layer 101 and then incident on the second structural layer 102, because the first refractive index n1 is greater than the second refractive index n2, the light incident on the second structural layer 102 after passing through the first structural layer 101 undergoes total reflection, so that the light reflected by the second structural layer 102 travels in a direction close to the center line (vertical center line) of the light-emitting element, thereby effectively enhancing light extraction efficiency while alleviating pixel crosstalk problems.

For example, as illustrated in FIG. 2, the thickness of the second structural layer 102 ranges from 1 m to 10 μm, but is not limited thereto.

For example, as illustrated in FIG. 2, the thickness of the first structural layer 101 ranges from 1 m to 10 μm, but is not limited thereto.

For example, as illustrated in FIG. 2, the thickness of the main body part MP of the pixel-defining layer PDL ranges from 1 m to 2 m, but is not limited thereto.

For example, in some embodiments, in order to enhance light extraction efficiency, the thickness of the first structural layer 101 is greater than the thickness of the second structural layer 102, and the thickness of the second structural layer 102 is greater than the thickness of the main body part MP.

FIG. 3A to FIG. 3D are cross-sectional views of display panels provided by embodiments of the present disclosure.

As illustrated in FIG. 2 and FIG. 3A to FIG. 3D, the second structural layer 102 is located on the main body part MP. In order to facilitate the formation of total reflection, the first structural layer 101 is filled in the space defined by the second structural layer 102. For example, that the second structural layer 102 is located on the main body part MP means that the second structural layer 102 is located above the main body part MP, and the orthographic projection of the second structural layer 102 on the base substrate BS falls within the orthographic projection of the main body part MP on the base substrate BS, including the case where the orthographic projection of the second structural layer 102 on the base substrate BS overlaps the orthographic projection of the main body part MP on the base substrate BS.

As illustrated in FIG. 2 and FIG. 3A to FIG. 3D, in order to facilitate manufacturing, the top surface of the first structural layer 101 does not go beyond the second structural layer 102 in the direction perpendicular to the base substrate BS.

For example, as illustrated in FIG. 2 and FIG. 3A to FIG. 3D, the orthographic projection of the second structural layer 102 on the base substrate BS falls within the orthographic projection of the main body part MP on the base substrate BS.

Figure 3A:
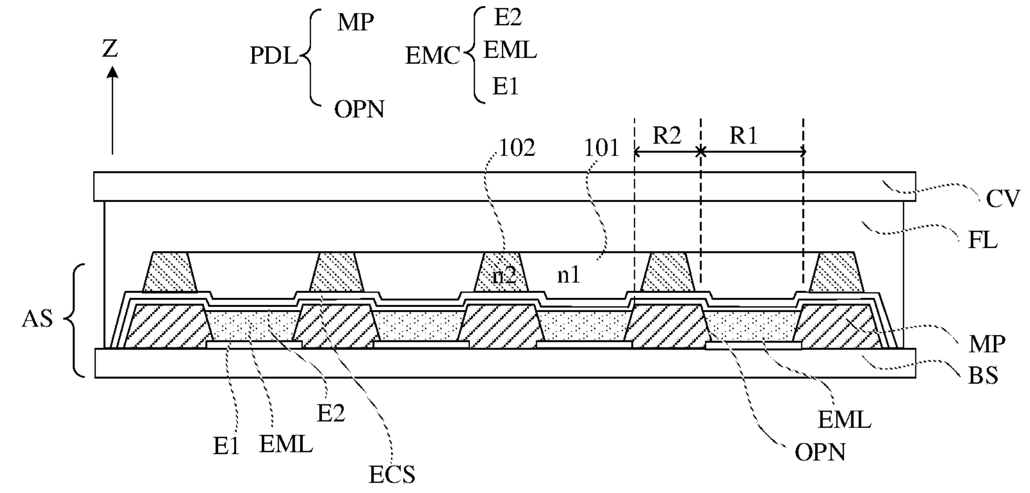
FIG. 3A to FIG. 3D are cross-sectional views of display panels provided by embodiments of the present disclosure.
Figure 3B:
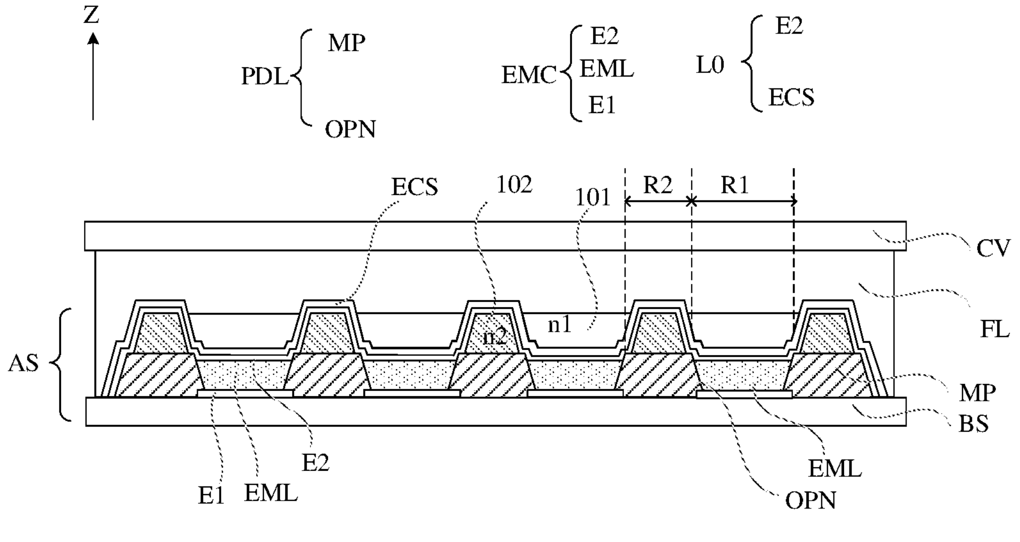
Figure 3C:
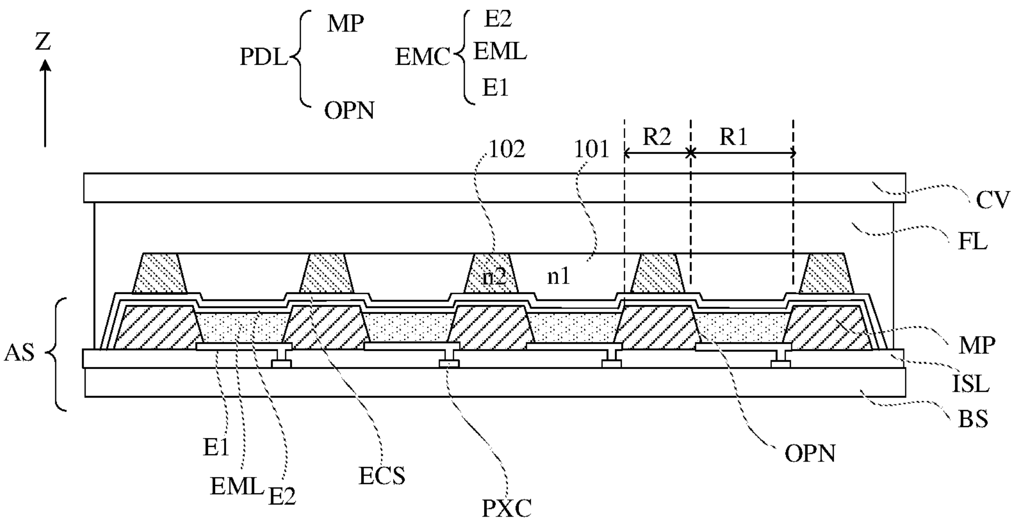
Figure 3D:
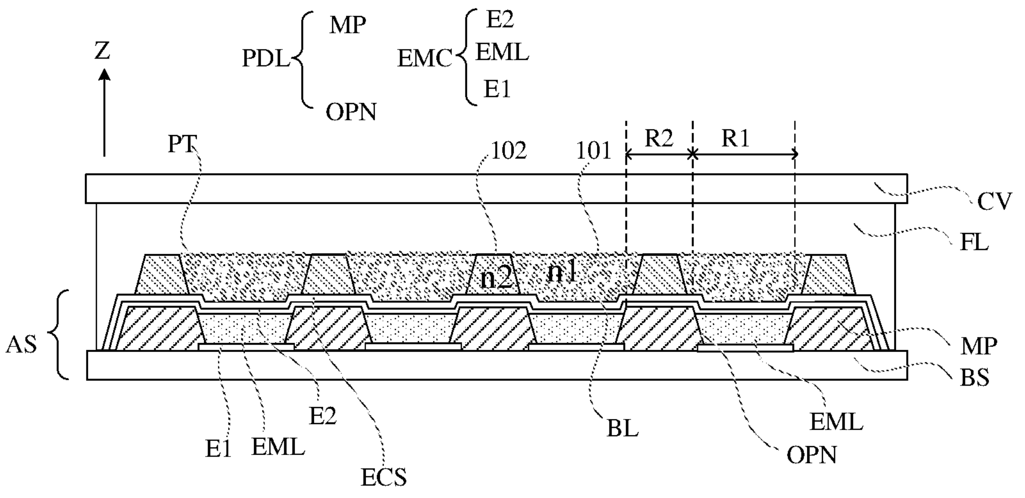

For example, as illustrated in FIG. 3D, the first structural layer 101 includes a base layer BL and filling particles PT located in the base layer BL. For example, the particle size of the filling particles PT is at the nanometer level. The second structural layer 102 can be formed using an inkjet printing process. The refractive index of the filling particles PT is greater than the refractive index of the base layer BL. For example, the filling particles PT may also be referred to as high-refractive particles. Providing filling particles PT having a high refractive index in the base layer BL can make the refractive index of the first structural layer 101 greater than the refractive index of the base layer BL and less than the refractive index of the filling particles PT. The greater the number of filling particles PT, the greater the refractive index of the first structural layer 101.

For example, as illustrated in FIG. 3D, the filling particles PT may include nano-zirconia particles but are not limited thereto, and selection can be made as required.

The material of the base layer BL of the first structural layer 101 may be the same as the material of the second structural layer 102. For example, the material of the base layer BL of the first structural layer 101 includes an acrylic material, and the material of the second structural layer 102 includes an acrylic material. Of course, the material of the base layer BL of the first structural layer 101 may also be different from the material of the second structural layer 102.

For example, as illustrated in FIG. 3D, the surface of the first structural layer 101 facing away from the base substrate BS has a concave-convex structure. As illustrated in FIG. 3D, the upper surface of the first structural layer 101 has a concave-convex structure. Due to the filling particles PT provided in the first structural layer 101, the surface of the first structural layer 101 facing away from the base substrate BS has a concave-convex structure. At the surface of the first structural layer 101 facing away from the base substrate BS, the filling particles PT protruding from the base layer BL form protrusions, and recesses are provided between the filling particles PT protruding from the base layer BL. Because the particle size of the filling particles PT is at the nanometer level, the concave-convex structure is also at the nanometer level.

For example, as illustrated in FIG. 2 and FIG. 3A to FIG. 3D, the refractive index (second refractive index n2) of the second structural layer 102 is less than or equal to 1.5, the refractive index (first refractive index n1) of the first structural layer 101 is greater than or equal to 1.5, and the first refractive index n1 is greater than the second refractive index n2. For example, the second structural layer 102 is made of an acrylic material, the refractive index (second refractive index n2) of the second structural layer 102 is about 1.5, the first structural layer 101 is made of an acrylic material having filling particles PT, and the refractive index (first refractive index n1) of the first structural layer 101 is about 1.57, but no limitation is made thereto.

Of course, in some other embodiments, the second structural layer 102 can be made of an acrylic material, and the first structural layer 101 can be made of an epoxy resin or an epoxy resin having filling particles PT. The refractive index of the epoxy resin is about 1.5-1.57, and the refractive index of the epoxy resin having filling particles PT can be greater than 1.6.

For example, as illustrated in FIG. 2 and FIG. 3A to FIG. 3D, the display panel further includes an adhesive layer FL. The adhesive layer FL is configured to adhere the array substrate AS and the cover plate CV.

For example, as illustrated in FIG. 2 and FIG. 3A to FIG. 3D, the adhesive layer FL covers the first structural layer 101 and covers the second structural layer 102.

For example, as illustrated in FIG. 2 and FIG. 3A to FIG. 3D, the refractive index of the adhesive layer FL is greater than or equal to the refractive index (second refractive index n2) of the second structural layer 102, and is less than or equal to the refractive index (first refractive index n1) of the first structural layer 101. For example, the refractive index of the adhesive layer FL is greater than or equal to 1.5 and less than or equal to 1.57.

For example, as illustrated in FIG. 2 and FIG. 3A to FIG. 3D, the adhesive layer FL is in contact with the first structural layer 101.

For example, as illustrated in FIG. 2 and FIG. 3A to FIG. 3D, the material of the adhesive layer FL is different from the material of the first structural layer 101 and different from the material of the second structural layer 102. For example, the material of the adhesive layer FL includes an epoxy resin (having a refractive index of about 1.50-1.57), but is not limited thereto.

In some embodiments, the second structural layer 102 can be made of an acrylic material (having a refractive index of about 1.48-1.50), the first structural layer 101 can be made of an acrylic material having filling particles PT (having a refractive index greater than or equal to 1.50 and greater than the refractive index of the second structural layer 102), and the adhesive layer FL is made of an epoxy resin (having a refractive index of about 1.50-1.57).

In other embodiments, the second structural layer 102 can be made of an acrylic material (having a refractive index of about 1.48-1.50), the first structural layer 101 can be made of an epoxy resin (having a refractive index of about 1.50-1.57) or an epoxy resin having filling particles PT (having a refractive index greater than 1.6), and the adhesive layer FL is made of an epoxy resin (having a refractive index of about 1.50-1.57).

For example, as illustrated in FIG. 2, FIG. 3A, and FIG. 3C to FIG. 3D, the adhesive layer FL is in contact with the first structural layer 101 and in contact with the second structural layer 102.

FIG. 3A to FIG. 3D illustrate the light-emitting element EMC. The light-emitting element EMC includes a first electrode E1, a second electrode E2, and a light-emitting functional layer EML located between the first electrode E1 and the second electrode E2. The opening OPN is configured to expose a portion of the first electrode E1. One sub-pixel 100 has one first electrode E1. For example, the light-emitting element EMC includes OLED or QLED, but is not limited thereto.

For example, the light-emitting functional layer EML includes a plurality of film layers, such as a light-emitting layer (light-emitting material layer). The light-emitting functional layer may also include at least one of a hole injection layer, a hole transport layer, an electron transport layer, an electron injection layer, and the like. The organic light-emitting functional layer can be selected as required. At least one film layer in the light-emitting functional layer can be manufactured by evaporation or inkjet printing.

As illustrated in FIG. 3A to FIG. 3D, the plurality of first electrodes E1 are separated from each other so as to be configured to input signals respectively.

FIG. 3B to FIG. 3D illustrate an encapsulation layer ECS. The encapsulation layer ECS is configured to encapsulate the light-emitting elements EMC so as to avoid water and oxygen invasion.

Figure 4:
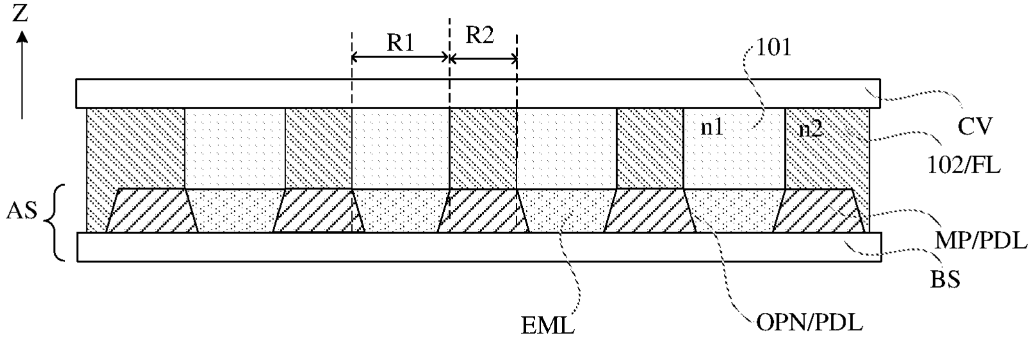
FIG. 4 is a cross-sectional view of a display panel provided by an embodiment of the present disclosure.
Figure 5:
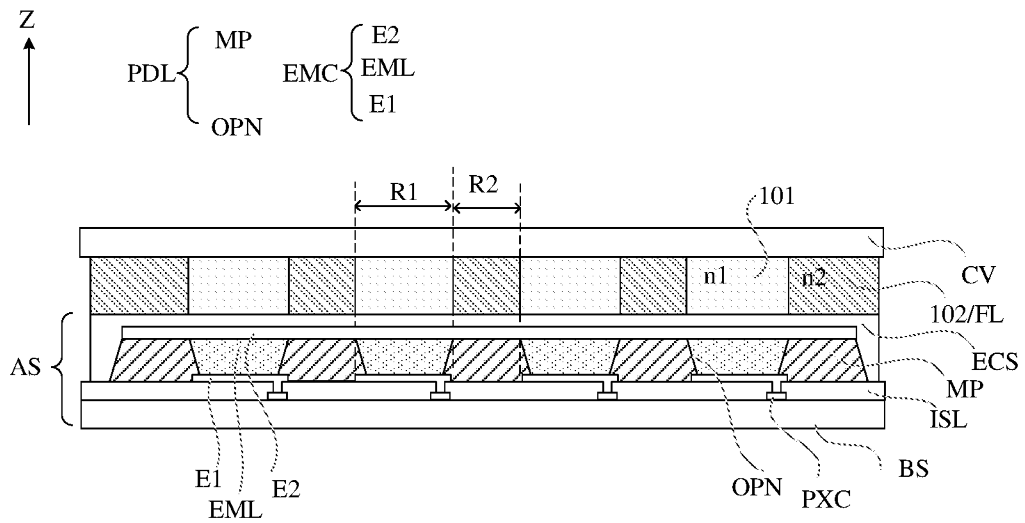
FIG. 5 is a cross-sectional view of a display panel provided by an embodiment of the present disclosure.
Figure 6:
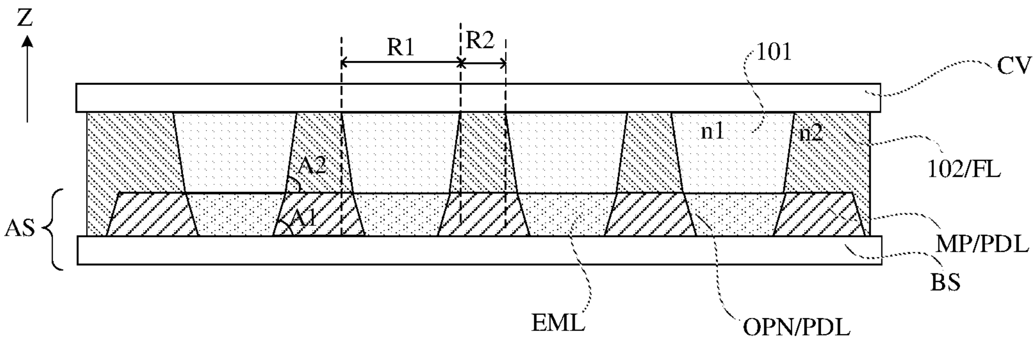
FIG. 6 is a cross-sectional view of a display panel provided by an embodiment of the present disclosure.

FIG. 4 is a cross-sectional view of a display panel provided by an embodiment of the present disclosure. FIG. 5 is a cross-sectional view of a display panel provided by an embodiment of the present disclosure. FIG. 6 is a cross-sectional view of a display panel provided by an embodiment of the present disclosure.

For example, as illustrated in FIG. 4 and FIG. 5, the display panel includes a base substrate BS and a pixel-defining layer PDL located on the base substrate BS. The display panel has a non-light-emitting region R2 and light-emitting regions R1. The non-light-emitting region R2 is located between adjacent light-emitting regions R1. The light-emitting region R1 is defined by the pixel-defining layer PDL.

As illustrated in FIG. 4 and FIG. 5, the display panel further includes a first structural layer 101 at least located in the plurality of light-emitting regions R1, and the display panel also includes a second structural layer 102 located in the non-light-emitting region R2. The first structural layer 101 has a first refractive index n1, the second structural layer 102 has a second refractive index n2, and the first refractive index n1 is greater than the second refractive index n2.

For example, as illustrated in FIG. 4 and FIG. 5, the area of the orthographic projection of the first structural layer 101 on the base substrate BS is not less than the area of the orthogonal projection of the light-emitting regions R1 on the base substrate BS, and the side surfaces of the first structural layer are in contact with the side surfaces of the second structural layer 102. Therefore, when the light emitted by the light-emitting element passes through the first structural layer 101 and is irradiated onto the interface of the first structural layer 101 and the second structural layer 102, total reflection occurs because the first refractive index n1 is greater than the second refractive index n2. Therefore, the light reflected by the second structural layer 102 travels in a direction close to the center line of the light-emitting element, thereby effectively enhancing light extraction efficiency and alleviating pixel crosstalk problems.

For example, as illustrated in FIG. 4 and FIG. 5, the first refractive index n1 of the first structural layer 101 is greater than 1.50, and the refractive index (second refractive index n2) of the second structural layer 102 is less than or equal to 1.50.

For example, as illustrated in FIG. 4 and FIG. 5, the material of the first structural layer 101 is different from the material of the second structural layer 102. For example, the material of the first structural layer 101 includes an epoxy resin, but is not limited thereto. For example, the first refractive index n1 of the first structural layer 101 is about 1.50-1.57. For example, the material of the second structural layer 102 includes an acrylic material. For example, the second refractive index n2 of the second structural layer 102 is about 1.48-1.50.

For example, as illustrated in FIG. 4 and FIG. 5, in some embodiments, the material of the first structural layer 101 includes an epoxy resin having filling particles (having a refractive index greater than 1.6) and the material of the second structural layer 102 includes an acrylic material (having a refractive index of about 1.48-1.50). For filling particles, reference may be made to what has been described above, and no further detail will be given here.

For example, as illustrated in FIG. 4 and FIG. 5, the display panel further includes a cover plate CV, which is in contact with the first structural layer 101 and in contact with the second structural layer 102.

For example, as illustrated in FIG. 4 and FIG. 5, in order to enhance light extraction efficiency, the first structural layer 101 completely covers the light-emitting regions R1. The orthographic projection of the first structural layer 101 on the base substrate completely covers the orthographic projection of the light-emitting regions R1 on the base substrate.

FIG. 5 illustrates an encapsulation layer ECS. The encapsulation layer ECS is configured to encapsulate the light-emitting elements EMC so as to avoid water and oxygen invasion.

FIG. 5 illustrates that the interface of the first structural layer 101 and the second structural layer 102 includes a plane. However, the interface of the first structural layer 101 and the second structural layer 102 may be in another forms, for example, the interface topography of the first structural layer 101 and the second structural layer 102 may be arc-shaped or have an inclined angle.

For example, as illustrated in FIG. 6, the cross-section of the first structural layer 101 is an inverted trapezoid.

In the display panel illustrated in FIG. 6, at least one of the first structural layer 101 and the second structural layer 102 can simultaneously serve as the adhesive layer FL so as to achieve bonding of the array substrate AS and the cover plate CV through at least one (serving as the adhesive layer FL) of the first structural layer 101 and the second structural layer 102. For example, one of the first structural layer 101 and the second structural layer 102 may not have adhesiveness, and the other has adhesiveness. For example, adhesiveness can be achieved by adding additives to a matrix material. Of course, the matrix material itself can also have adhesiveness.

As illustrated in FIG. 6, in order to further avoid pixel crosstalk and improve display effect, the slope angle A1 of the main body part MP of the pixel-defining layer PDL is less than the slope angle A2 of the second structural layer 102.

For example, as illustrated in FIG. 6, in order to allow more light to be totally reflected so as to enhance light extraction efficiency, the thickness of the first structural layer 101 is greater than the thickness of the main body part MP of the pixel-defining layer PDL, and the thickness of the second structural layer 102 is greater than the thickness of the main body part MP of the pixel-defining layer PDL.

For example, as illustrated in FIG. 6, the thickness of the first structural layer 101 ranges from 5 μm to 25 m, but is not limited thereto.

For example, as illustrated in FIG. 6, the thickness of the second structural layer 102 ranges from 5 μm to 25 m, but is not limited thereto.

For example, as illustrated in FIG. 6, the thickness of the first structural layer 101 may be equal to the thickness of the first structural layer 101.

For example, as illustrated in FIG. 6, the thickness of the main body part MP of the pixel-defining layer PDL ranges from 1 m to 2 m, but is not limited thereto.

Figure 7:
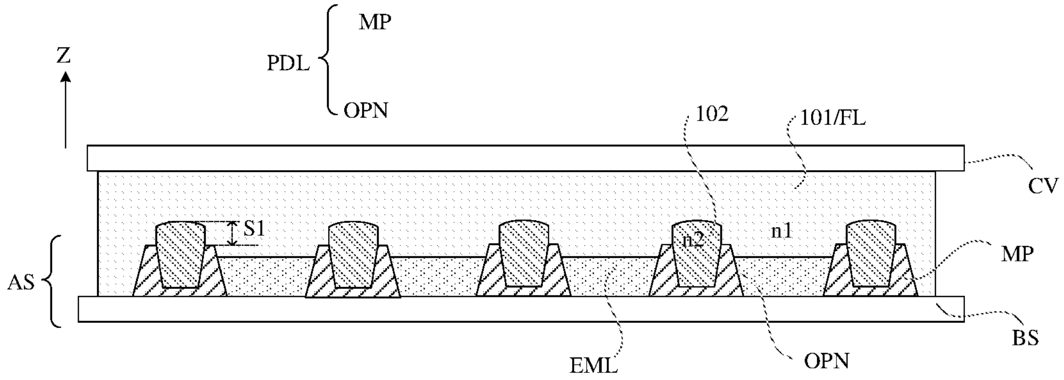
FIG. 7 is a cross-sectional view of a display panel provided by an embodiment of the present disclosure.
Figure 8A:
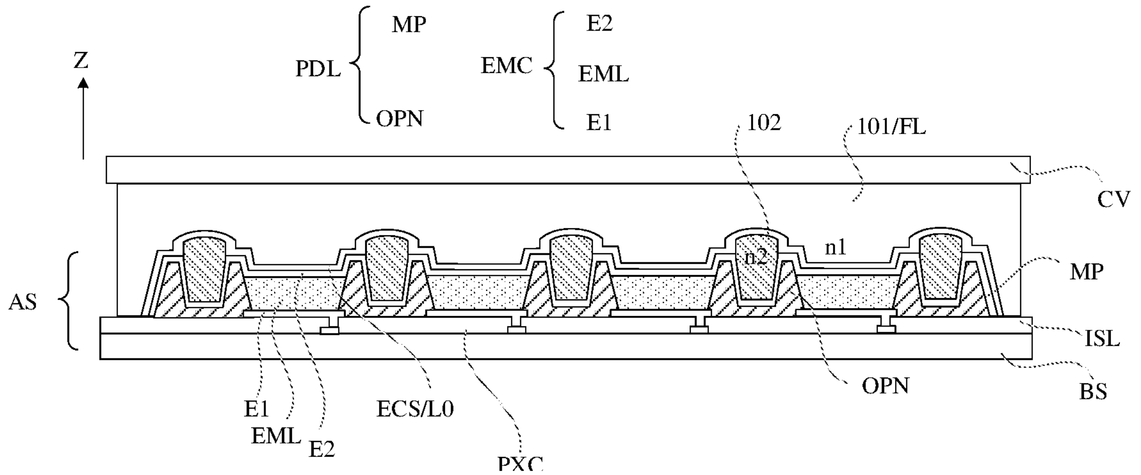
FIG. 8A is a cross-sectional view of a display panel provided by an embodiment of the present disclosure.
Figure 8B:
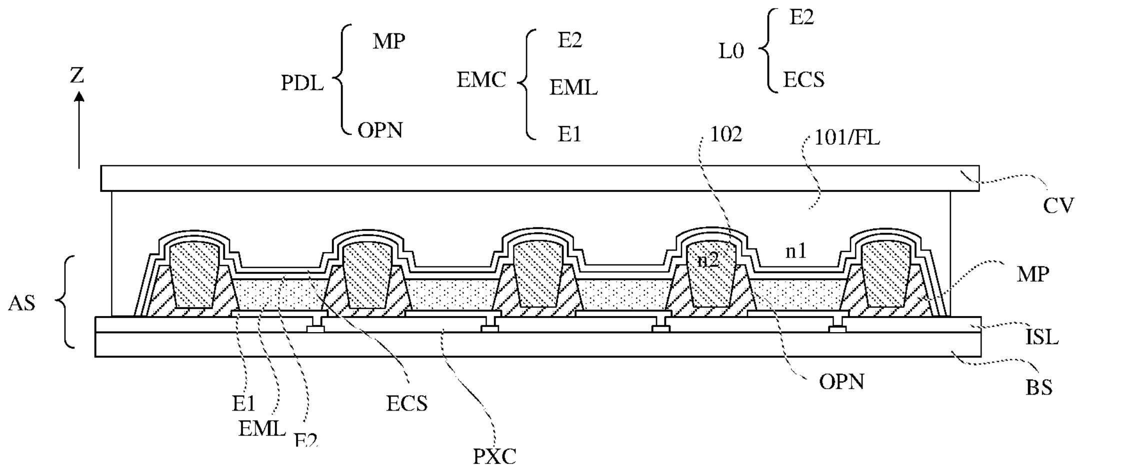
FIG. 8B is a cross-sectional view of a display panel provided by another embodiment of the present disclosure.

FIG. 7 is a cross-sectional view of a display panel provided by an embodiment of the present disclosure. FIG. 8A is a cross-sectional view of a display panel provided by an embodiment of the present disclosure. FIG. 8B is a cross-sectional view of a display panel provided by another embodiment of the present disclosure.

For example, as illustrated in FIG. 7, FIG. 8A and FIG. 8B, the display panel includes a base substrate BS and a pixel-defining layer PDL located on the base substrate BS. The display panel has a non-light-emitting region R2 and light-emitting regions R1. The non-light-emitting region R2 is located between adjacent light-emitting regions R1. The light-emitting region R1 is defined by the pixel-defining layer PDL.

As illustrated in FIG. 7, FIG. 8A and FIG. 8B, the display panel further includes a first structural layer 101 at least located in a plurality of light-emitting regions R1. The display panel also includes a second structural layer 102 located in the non-light-emitting region R2. The first structural layer 101 has a first refractive index n1, the second structural layer 102 has a second refractive index n2, and the first refractive index n1 is greater than the second refractive index n2.

As illustrated in FIG. 7, FIG. 8A and FIG. 8B, the main body part MP has a groove GR, and the second structural layer 102 is filled in the groove GR and protrudes from the main body part MP.

For example, as illustrated in FIG. 7, FIG. 8A and FIG. 8B, when the light emitted by the light-emitting element EMC passes through the first structural layer 101 and is irradiated onto the second structural layer 102, total reflection occurs on the surface of the second structural layer 102. Therefore, the light reflected by the second structural layer 102 travels in a direction close to the center line of the light-emitting element, thereby effectively enhancing light extraction efficiency and alleviating pixel crosstalk problems.

FIG. 7, FIG. 8A and FIG. 8B further illustrate an encapsulation layer ECS. The encapsulation layer ECS is configured to encapsulate the light-emitting elements EMC so as to avoid water and oxygen invasion.

As illustrated in FIG. 8A and FIG. 8B, the first structural layer 101 also serves as the adhesive layer FL.

For example, as illustrated in FIG. 7, FIG. 8A and FIG. 8B, the material of the second structural layer 102 includes an acrylic material (having a refractive index of about 1.48-1.50), and the material of the first structural layer 101 includes an epoxy resin (having a refractive indexx of about 1.50-1.57), but is not limited thereto. For example, as illustrated in FIG. 7, FIG. 8A and FIG. 8B, the first refractive index n1 of the first structural layer 101 is about 1.50-1.57, and the second refractive index n2 of the second structural layer 102 is about 1.48-1.50.

Of course, in other embodiments, the material of the second structural layer 102 includes an acrylic material (having a refractive index of about 1.48-1.50), and the material of the first structural layer 101 includes an epoxy resin having filling particles (having a refractive index greater than 1.6). For filling particles, reference may be made to what has been described above, and no further detail will be given here.

For example, as illustrated in FIG. 7, FIG. 8A and FIG. 8B, the display panel further includes an adhesive layer FL and a cover plate CV. The cover plate CV is bonded to the base substrate BS through the adhesive layer FL. The refractive index of the adhesive layer FL is greater than the second refractive index. For example, the cover plate CV can be a color filter substrate, but is not limited thereto. For example, the cover plate CV includes a base substrate and a color filter layer located on the base substrate. As illustrated in FIG. 7, FIG. 8A and FIG. 8B, the first structural layer 101 may serve as the adhesive layer FL.

As illustrated in FIG. 8A, the second structural layer 102 is formed after the second electrode E2 is formed. Compared with the display panel illustrated in FIG. 8A, the display panel illustrated in FIG. 8B has the second electrode E2 formed after the second structural layer 102 is formed. As illustrated in FIG. 8B, the second electrode E2 covers the second structural layer 102.

As illustrated in FIG. 7, FIG. 8A and FIG. 8B, in order to further enhance light extraction efficiency and alleviate pixel crosstalk problems, the ratio of the maximum size S1 of the portion of the second structural layer 102 protruding from the main body part MP (as illustrated in FIG. 7) to the maximum thickness of the main body part MP is greater than or equal to 1:2 and less than or equal to 3:2. Furthermore, for example, the ratio of the maximum size S1 of the portion of the second structural layer 102 protruding from the main body part MP (as illustrated in FIG. 7) to the maximum thickness of the main body part MP is greater than or equal to 1:2 and less than or equal to 1:1.

For example, as illustrated in FIG. 8A and FIG. 8B, the thickness of the first structural layer 101 ranges from 5 μm to 25 m, but is not limited thereto.

For example, as illustrated in FIG. 8A and FIG. 8B, the thickness of the second structural layer 102 ranges from 1 m to 10 μm, but is not limited thereto.

For example, as illustrated in FIG. 8A and FIG. 8B, the thickness of the main body part MP of the pixel-defining layer PDL ranges from 1 m to 2 m, but is not limited thereto.

FIG. 9 to FIG. 12 illustrate a method for manufacturing a second structural layer in the display panel illustrated in FIG. 7, FIG. 8A and FIG. 8B.

Figure 9:
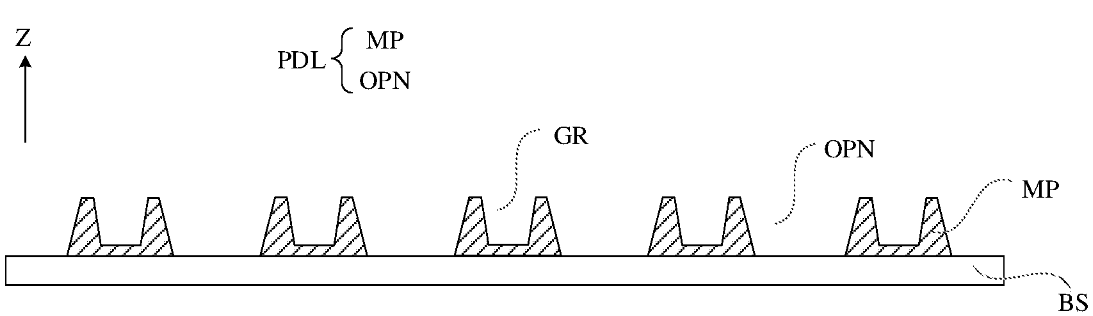
FIG. 9 to FIG. 12 illustrate a method for manufacturing a second structural layer in the display panel illustrated in FIG. 7, FIG. 8A and FIG. 8B.

As illustrated in FIG. 9, forming a pixel-defining layer PDL on the base substrate BS. FIG. 9 illustrates the main body part MP and the opening OPN of the pixel-defining layer PDL. The main body part MP has a groove GR.

Figure 10:
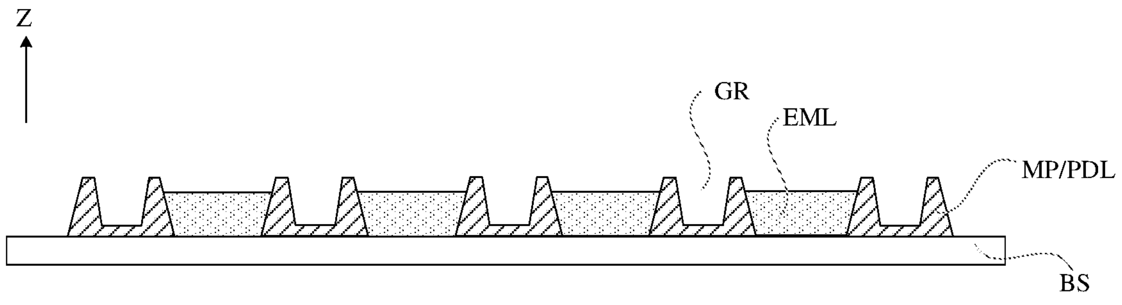

As illustrated in FIG. 10, forming a light-emitting functional layer EML at the opening OPN.

Figure 11:
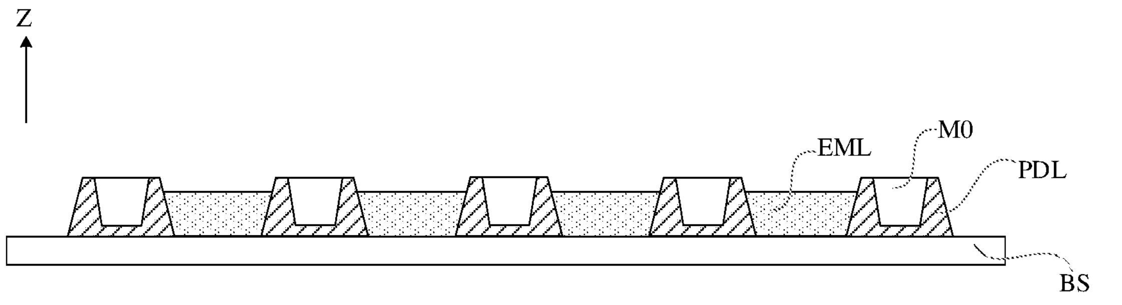

As illustrated in FIG. 11, filling the groove GR with an expandable material MO. The expandable material MO may be formed in the groove GR by an inkjet printing process.

Figure 12:
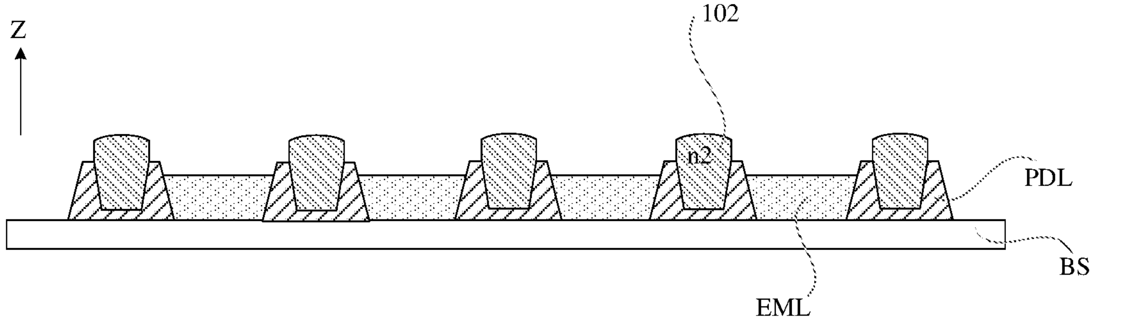

As illustrated in FIG. 12, performing a heating process to expand the expandable material MO so as to obtain a second structural layer 102 protruding from the main body part MP.

For example, in order not to affect any other structure such as the light-emitting functional layer EML during the heating process, the heating temperature is not greater than 120° C. during the heating process. For example, the heating temperature is greater than or equal to 100° C., that is, the heating temperature is greater than or equal to 100° C. and less than 120° C. Furthermore, for example, the heating temperature is greater than or equal to 110° C., that is, the heating temperature is greater than or equal to 110° C. and less than 120° C.

For example, the expandable material MO includes an acrylic material. For example, the acrylic material has a refractive index of about 1.48-1.50.

For example, the expandable material MO (as illustrated in FIG. 11) may be filled in the groove GR after the light-emitting functional layer EML and the second electrode E2 are formed, in which case the display panel illustrated in FIG. 8A may be formed. For example, the expandable material MO can be filled in the groove GR, and a heating process can be performed to expand the expandable material MO so as to form the light-emitting functional layer EML and the second electrode E2 after obtaining the second structural layer 102. In this case, the display panel illustrated in FIG. 8B can be formed. The second electrode E2 is not illustrated in FIG. 10 to FIG. 12. For the second electrode E2, reference can be made to FIG. 8A and FIG. 8B.

Figure 13:
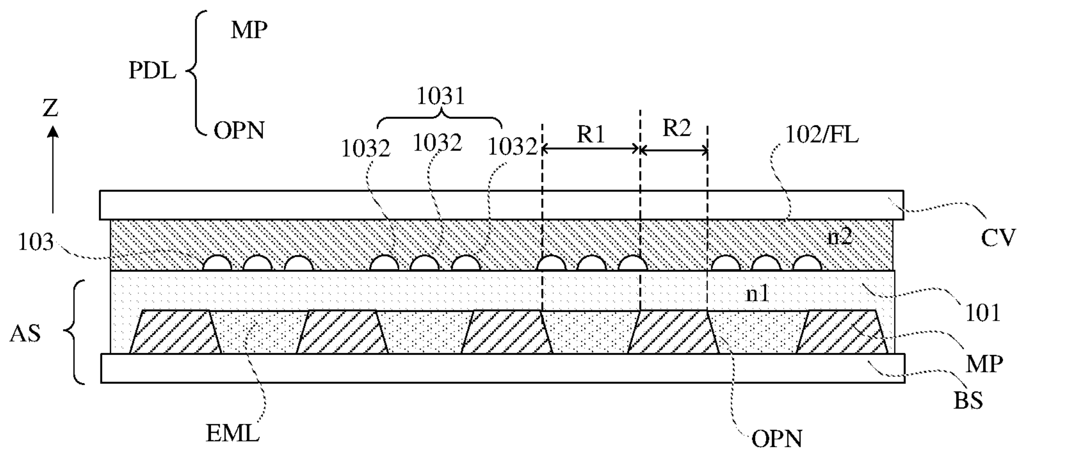
FIG. 13 is a cross-sectional view of a display panel provided by an embodiment of the present disclosure.
Figure 14:
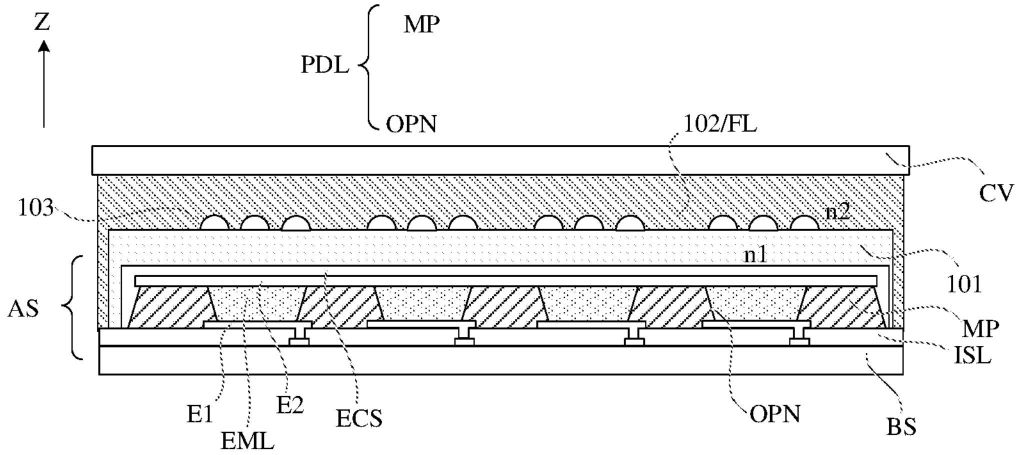
FIG. 14 is a cross-sectional view of a display panel provided by an embodiment of the present disclosure.
Figure 15:
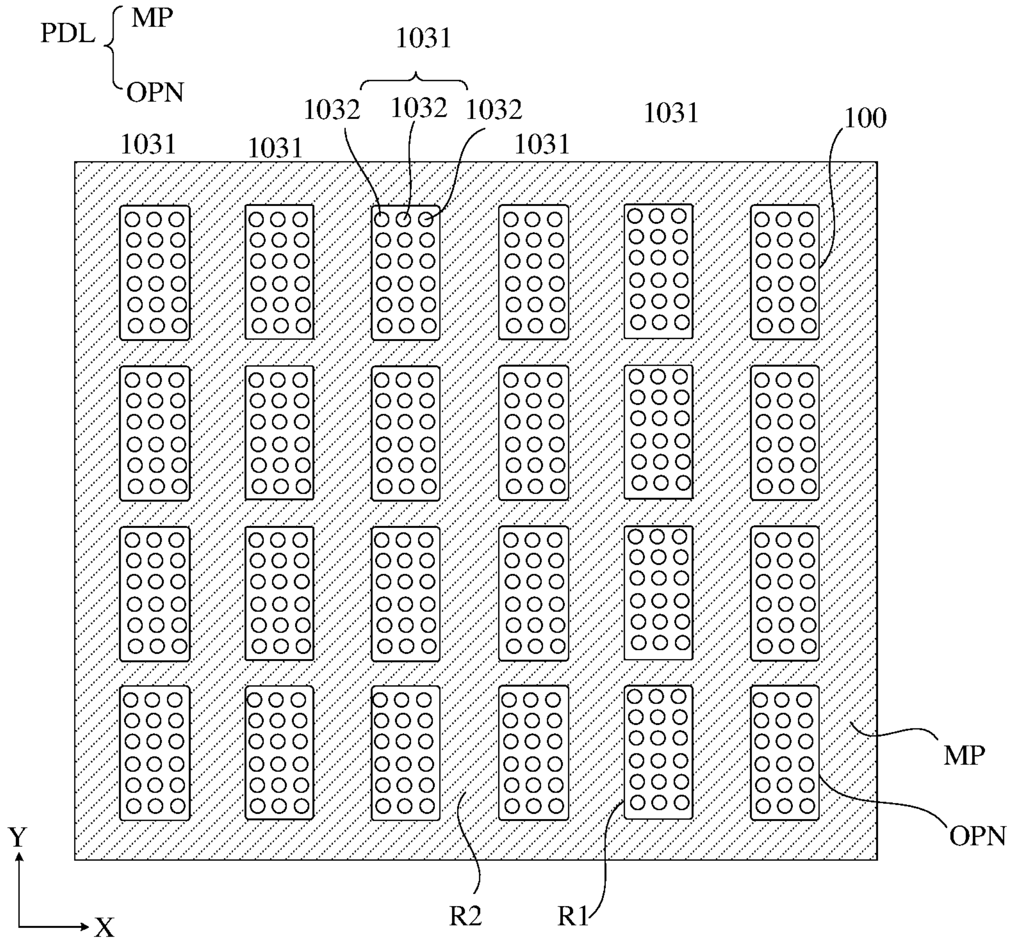
FIG. 15 is a plan view of a display panel provided by an embodiment of the present disclosure.

FIG. 13 is a cross-sectional view of a display panel provided by an embodiment of the present disclosure. FIG. 14 is a cross-sectional view of a display panel provided by an embodiment of the present disclosure. FIG. 15 is a plan view of a display panel provided by an embodiment of the present disclosure.

For example, as illustrated in FIG. 13 and FIG. 14, the display panel includes a base substrate BS and a pixel-defining layer PDL located on the base substrate BS. The display panel has a non-light-emitting region R2 and a light-emitting region R1. The non-light-emitting region R2 is located between adjacent light-emitting regions R1. The light-emitting region R1 is defined by the pixel-defining layer PDL.

As illustrated in FIG. 13 and FIG. 14, the display panel further includes a first structural layer 101 at least located in the plurality of light-emitting regions R1, and the display panel also includes a second structural layer 102 located in the non-light-emitting region R2. The first structural layer 101 has a first refractive index n1, the second structural layer 102 has a second refractive index n2, and the first refractive index n1 is greater than the second refractive index n2.

For example, as illustrated in FIG. 13 and FIG. 14, the light emitted by the light-emitting element EMC passes through the first structural layer 101 and is irradiated onto the lens layer 103. The lens layer 103 produces a light gathering effect, changes the direction of the inclined light, and enhances the vertical light, thus effectively enhancing light extraction efficiency and alleviating pixel crosstalk problems.

For example, as illustrated in FIG. 13 and FIG. 14, the first structural layer 101 is located in the light-emitting region R1 and located in the non-light-emitting region R2, the second structural layer 102 is located in the light-emitting region R1 and located in the non-light-emitting region R2, and the first structural layer 101 is closer to the base substrate BS than the second structural layer 102.

For example, as illustrated in FIG. 14, the display panel further includes an encapsulation layer ECS, and the encapsulation layer ECS is configured to encapsulate the light-emitting elements EMC so as to avoid water and oxygen invasion. For example, as illustrated in FIG. 14, the first structural layer 101 is located on the encapsulation layer ECS.

For example, as illustrated in FIG. 14, the first structural layer 101 is in contact with the encapsulation layer ECS.

For example, as illustrated in FIG. 14, the first structural layer 101 can be manufactured by spin coating, inkjet printing, slit coating, and other processes.

For example, as illustrated in FIG. 14, the refractive index (first refractive index n1) of the first structural layer 101 is greater than 1.6. Furthermore, for example, the refractive index (first refractive index n1) of the first structural layer 101 is greater than 1.7.

For example, as illustrated in FIG. 14, the first structural layer 101 may be provided with filling particles, and the filling particles may include zirconia having a particle size at the nanometer level.

For example, as illustrated in FIG. 14, the material of the first structural layer 101 is not affected by photolithography and cannot be patterned by photolithography. For example, the material of the first structural layer 101 does not include a photosensitive agent.

For example, as illustrated in FIG. 13 to FIG. 15, the display panel further includes a lens layer 103. As illustrated in FIG. 13 and FIG. 14, the lens layer 103 is located between the first structural layer 101 and the second structural layer 102.

For example, as illustrated in FIG. 13 to FIG. 15, the lens layer 103 includes a plurality of lens groups 1031, each lens group 1031 includes a plurality of lens units 1032, and the orthographic projection of the plurality of lens units 1032 on the base substrate BS overlaps the orthographic projection of the opening OPN on the base substrate BS.

For example, as illustrated in FIG. 13 to FIG. 15, the lens layer 103 is located in the light-emitting regions R1, and each sub-pixel 100 includes a plurality of lens units 1032. For example, the lens layer 103 can be manufactured using a photolithography process.

For example, as illustrated in FIG. 13 to FIG. 15, the lens unit 1032 may have a hemispherical topography. For example, the diameter of the lens unit 1032 is twice the height of the lens unit 1032.

For example, as illustrated in FIG. 13 to FIG. 15, the refractive index of the lens layer 103 is less than the refractive index (first refractive index n1) of the first structural layer 101.

For example, as illustrated in FIG. 13 to FIG. 15, the refractive index (first refractive index n1) of the first structural layer 101 is about 1.8. As illustrated in FIG. 13 to FIG. 15, the material of the first structural layer 101 includes a matrix material and filling particles doped therein. The matrix material includes an acrylic material or an epoxy resin. For example, the filling particles are particles having a high refractive index. For example, the filling particles include zirconia particles, but are not limited thereto. For filling particles, reference may be made to what has been described above, and no further detail will be given here.

For example, as illustrated in FIG. 13 to FIG. 15, the material of the lens layer 103 has a refractive index of about 1.5-1.6. For example, the refractive index of the lens layer 103 is about 1.5, and the material of the lens layer 103 includes an acrylic material.

For example, the refractive index of the lens layer 103 is greater than 1.5 and less than or equal to 1.6, and the material of the lens layer 103 includes an acrylic matrix material and filling particles doped therein, that is, an acrylic material doped with filling particles. For example, the filling particles are particles having a high refractive index. For example, the filling particles include zirconia particles. For example, in addition to a matrix material such as an acrylic material, the material of the lens layer 103 may also be doped with a material such as a photosensitizer. It should be noted that the lens layer 103 can also be made of other suitable materials.

For example, the diameter of the lens unit 1032 is greater than or equal to the height of the lens unit 1032, but is not limited thereto.

In the embodiments of the present disclosure, the height of a component refers to the dimension of the component in a direction perpendicular to the base substrate.

For example, as illustrated in FIG. 13 and FIG. 14, the diameter of the lens unit 1032 in the lens layer 103 is at the micron level.

For example, as illustrated in FIG. 13 and FIG. 14, the height of the lens unit 1032 in the lens layer 103 is at the micron level.

For example, as illustrated in FIG. 13 and FIG. 14, the diameter of the lens unit 1032 in the lens layer 103 is about 9 m, and the height of the lens unit 1032 in the lens layer 103 is about 4.5 μm.

For example, as illustrated in FIG. 15, the length of the sub-pixel 101 is about 106 m and the width of the sub-pixel 101 is about 30 m, but no limitation is made thereto.

For example, as illustrated in FIG. 15, the filling rate of the lens unit 1032 is greater than 50%. That is, in one sub-pixel 100, the ratio of the sum of the areas of the lens units 1032 to the area of the light-emitting region of the sub-pixel 100 is greater than 50%. The number of lens units 1032 is not limited to that illustrated in the figure. The filling rate refers to the ratio of the sum of the areas of the lens units 1032 in one sub-pixel 100 to the area of the light-emitting region of the sub-pixel 100.

By adjusting the thickness of the first structural layer 101 (>5 μm), the lens layer 103 can produce a light gathering effect, reduce inclined ligh, and increase vertical light emission.

FIG. 15 is described by taking as an example that the lens unit 1032 is provided in the light-emitting region R1. The lens unit 1032 is provided in the light-emitting region R1 and not provided in the non-light-emitting region R2, thus helping avoiding color mixing.

In other embodiments, the lens unit 1032 can be provided in the light-emitting region R1 and the non-light-emitting region R2. In this case, it helps further reduce inclined light and increase vertical light emission.

For example, as illustrated in FIG. 13 and FIG. 14, the thickness of the first structural layer 101 is greater than the thickness of the lens layer 103.

For example, as illustrated in FIG. 13 and FIG. 14, the thickness of the first structural layer 101 is greater than 1 μm.

For example, as illustrated in FIG. 13 and FIG. 14, in order to enhance light extraction efficiency, the thickness of the first structural layer 101 is greater than 5 μm.

For example, as illustrated in FIG. 13 and FIG. 14, the thickness of the first structural layer 101 is less than or equal to 20 m. For example, the thickness of the first structural layer 101 ranges from 5 μm-20 μm.

For example, as illustrated in FIG. 13 and FIG. 14, the thickness of the first structural layer 101 ranges from 5 μm to 10 μm. For example, the thickness of the first structural layer 101 is about 10 μm.

For example, as illustrated in FIG. 13 and FIG. 14, the thickness of the main body part MP of the pixel-defining layer PDL ranges from 1 μm to 2 μm.

For example, as illustrated in FIG. 13 and FIG. 14, the thickness of the second structural layer 102 is greater than the thickness of the first structural layer 101.

For example, as illustrated in FIG. 13 and FIG. 14, the thickness of the second structural layer 102 ranges from 5 to 25 m, but is not limited thereto.

For example, as illustrated in FIG. 13 and FIG. 14, the refractive index (second refractive index n2) of the second structural layer 102 is about 1.4. For example, the material of the second structural layer 102 includes a silicon-based material. For example, the material of the second structural layer 102 includes a silicone-based resin.

For example, as illustrated in FIG. 13 and FIG. 14, the second structural layer 102 also serves as the adhesive layer FL. For example, the material of the second structural layer 102 is a silicon-based adhesive. For example, as illustrated in FIG. 13 and FIG. 14, the material of the second structural layer 102 (adhesive layer FL) includes an organosilicon adhesive.

For example, as illustrated in FIG. 13 and FIG. 14, the material of the first structural layer 101 includes an acrylic material doped with filling particles (having a refractive index greater than 1.6) or an epoxy resindoped with filling particles (having a refractive index greater than 1.6, for example, a refractive index of about 1.8), the second structural layer 102 also serves as the adhesive layer FL, and the material of the second structural layer 102 includes a silicon-based resin (having a refractive index of about 1.4). For filling particles, reference may be made to what has been described above, and no further detail will be given here.

For example, as illustrated in FIG. 13 and FIG. 14, the display panel further includes a cover plate CV bonded to the array substrate AS through an adhesive layer FL (second structural layer 102).

In the display panel provided by the embodiments of the present disclosure such as in FIG. 13 to FIG. 15, at least one of the structure of the lens layer 103 and the thickness of the first structural layer 101 is adjusted so as to cause the lens layer 103 to produce a light gathering effect, change the direction of inclined light, increase the vertical light, and also alleviate the problem of crosstalk caused by inclined light.

Figure 16:
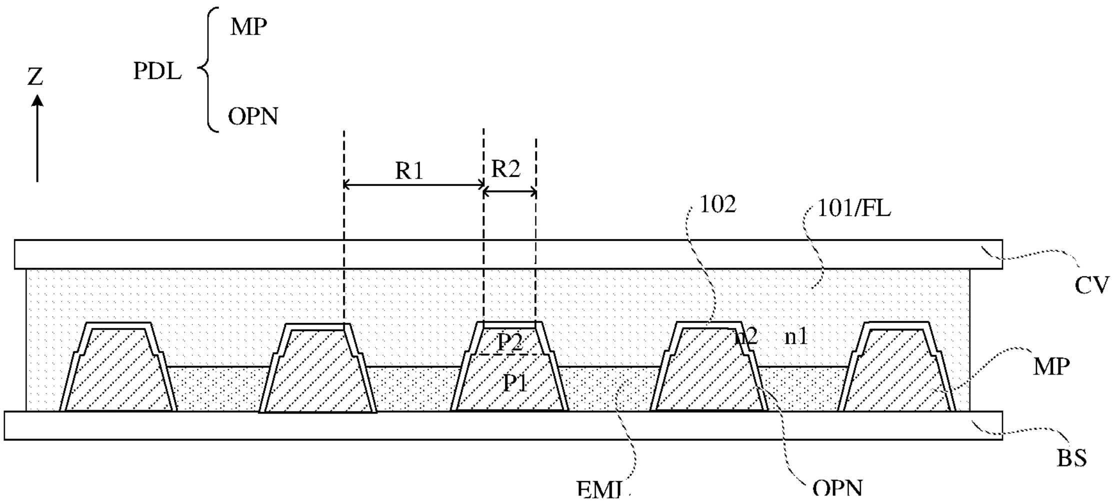
FIG. 16 is a cross-sectional view of a display panel provided by another embodiment of the present disclosure.
Figure 17:
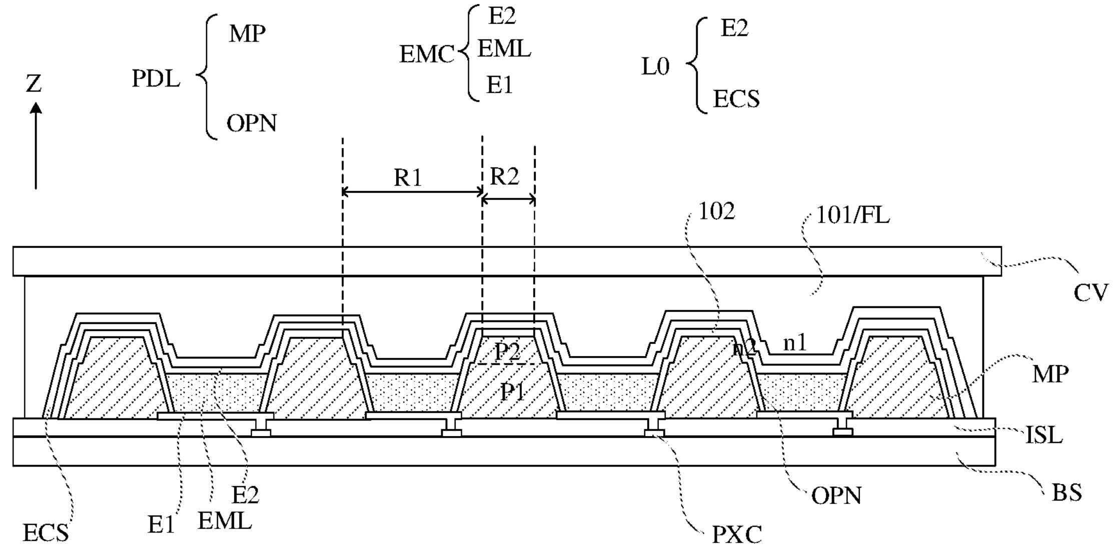
FIG. 17 is a cross-sectional view of another display panel provided by an embodiment of the present disclosure.

FIG. 16 is a cross-sectional view of a display panel provided by another embodiment of the present disclosure. FIG. 17 is a cross-sectional view of another display panel provided by an embodiment of the present disclosure.

For example, as illustrated in FIG. 16 and FIG. 17, the display panel includes a base substrate BS and a pixel-defining layer PDL located on the base substrate BS. The display panel has a non-light-emitting region R2 and a light-emitting region R1. The non-light-emitting region R2 is located between adjacent light-emitting regions R1. The light-emitting region R1 is defined by the pixel-defining layer PDL.

As illustrated in FIG. 16 and FIG. 17, the display panel further includes a first structural layer 101 at least located in the plurality of light-emitting regions R1, and the display panel also includes a second structural layer 102 located in the non-light-emitting region R2. The first structural layer 101 has a first refractive index n1, the second structural layer 102 has a second refractive index n2, and the first refractive index n1 is greater than the second refractive index n2.

For example, as illustrated in FIG. 16 and FIG. 17, the area of the first structural layer 101 is not less than the area of the light-emitting region R1, and the side surface of the first structural layer 101 is in contact with the side surface of the second structural layer 102. Thus, when the light emitted by the light-emitting element passes through the first structural layer 101 and is irradiated onto the interface of the first structural layer 101 and the second structural layer 102, total reflection occurs because the first refractive index n1 is greater than the second refractive index n2. Therefore, the light reflected by the second structural layer 102 travels in a direction close to the center line of the light-emitting element, thereby effectively enhancing light extraction efficiency and alleviating pixel crosstalk problem.

For example, as illustrated in FIG. 16 and FIG. 17, the side surface of the main body part MP have a step shape, and the second structural layer 102 covers the side surface and the top surface of the main body part MP.

For example, as illustrated in FIG. 16 and FIG. 17, the main body part MP has a first body P1 and a second body P2. A step is provided between the first body P1 and the second body P2. The first body P1 is closer to the base substrate BS than the second body P2, and the first structural layer 101 is at least filled in the space defined by the second body P2.

For example, as illustrated in FIG. 16 and FIG. 17, the second structural layer 102 does not overlap the bottom surface of the opening OPN. For example, the material of the second structural layer 102 at the bottom surface of the opening OPN can be removed by an etching process.

For example, as illustrated in FIG. 16 and FIG. 17, the material of the second structural layer 102 includes silicon oxide (SiOx), and the refractive index (second refractive index n2) of the second structural layer 102 is about 1.5.

For example, as illustrated in FIG. 16 and FIG. 17, the first structural layer 101 also serves as the adhesive layer FL. The refractive index (first refractive index n1) of the first structural layer 101 is greater than 1.6, and the first refractive index n1 is greater than the second refractive index n2.

For example, as illustrated in FIG. 16 and FIG. 17, the material of the first structural layer 101 includes a matrix material and filling particles doped therein. The matrix material includes an acrylic material or an epoxy resin. For example, the filling particles are particles with a high refractive index. For example, the filling particles include zirconia particles, but are not limited thereto.

For example, as illustrated in FIG. 16 and FIG. 17, the material of the first structural layer 101 includes an acrylic material doped with filling particles (having a refractive index greater than 1.6) or an epoxy resin doped with filling particles (having a refractive index greater than 1.6), and the material of the second structural layer 102 includes silicon oxide (having a refractive index of about 1.5).

As illustrated in FIG. 16 and FIG. 17, the light emitted by the light-emitting element EMC passes through the first structural layer 101 and reaches the second structural layer 102, and total reflection occurs at the interface, making the inclined light gather inward, increasing the amount of vertical light emission, and at the same time alleviating crosstalk problems.

For example, in the embodiments of the present disclosure, the material of the encapsulation layer ECS includes an inorganic encapsulation layer. For example, the inorganic encapsulation layer includes at least one of silicon oxide (SiOx), silicon nitride (SiNx), and silicon oxynitride (SiNxOy).

For example, in the embodiments of the present disclosure, the material of the encapsulation layer ECS may also include a stacked layer of an inorganic encapsulation layer, an organic encapsulation layer, and an inorganic encapsulation layer. For example, the material of the inorganic encapsulation layer may include at least one of silicon oxide (SiOx), silicon nitride (SiNx) and silicon oxynitride (SiNxOy), and the material of the organic encapsulation layer includes an organic resin.

For example, in the embodiments of the present disclosure, the insulating layer ISL includes at least one of an inorganic insulating layer and an organic insulating layer. For example, inorganic insulating material includes silicon oxide, silicon nitride, silicon oxynitride, and the like, and organic insulating material includes a resin, but not limited thereto.

For example, the base substrate BS includes a flexible material such as polyimide or a rigid material such as glass, but is not limited thereto.

For example, one of the first electrode E1 and the second electrode E2 is an anode, and the other one of the first electrode E1 and the second electrode E2 is a cathode.

For example, the material of the first electrode E1 of the light-emitting element includes a conductive material, for example, includes at least one of silver (Ag) or indium tin oxide (ITO), but is not limited thereto. For example, the first electrode E1 of the light-emitting element has a three-layer stacked structure of ITO/Ag/ITO, but is not limited thereto. In other embodiments, the material of the first electrode E1 of the light-emitting element includes aluminum (Al) and tungsten oxide (WOx). For example, the first electrode E1 includes a stack of an aluminum layer and a tungsten oxide layer, and the aluminum layer is closer to the base substrate than the tungsten oxide layer.

For example, the material of the second electrode E2 of the light-emitting element includes a conductive material, such as at least one of magnesium (Mg), silver (Ag), or indium zinc oxide (IZO), but is not limited thereto. For example, in some embodiments, the material of the second electrode E2 of the light-emitting element includes Mg/Ag alloy.

As illustrated in FIG. 3A to FIG. 3D, FIG. 5, FIG. 8A, FIG. 8B, FIG. 14, and FIG. 17, the first electrode E1 is connected to the pixel circuit PXC. The pixel circuit PXC may include a transistor (T) and a storage capacitor (C), but is not limited thereto. For example, the pixel circuit PXC includes pixel circuits of 3T1C, 5T1C, 5T2C, 7T1C, and 7T2C, but is not limited thereto. The number of transistors and the number of storage capacitors included in the pixel circuit PXC can be determined as required.

FIG. 3C, FIG. 5, FIG. 8A, FIG. 8B, FIG. 14, and FIG. 17 also illustrate the insulating layer ISL. The first electrode E1 is located on the insulating layer ISL and is connected to the pixel circuit PXC through a via hole running through the insulating layer ISL.

As illustrated in FIG. 3C, the pixel circuit PXC is schematically illustrated in the figure, and the specific structure of the pixel circuit PXC can be determined as required.

For the sake of clarity, some figures provided by an embodiment of the present disclosure do not illustrate the first electrode E1, the pixel circuit PXC and other structures.

As illustrated in FIG. 3B, FIG. 8A, FIG. 8B, and FIG. 17, an intermediate film layer L0 is provided between the first structural layer 101 and the second structural layer 102. For example, the refractive index of the intermediate film layer L0 is greater than the refractive index (second refractive index n2) of the second structural layer 102. The intermediate film layer L0 may absorb part of the light. In the case where the intermediate film layer L0 is provided between the first structural layer 101 and the second structural layer 102, the total reflection interface is still on the surface of the second structural layer 102. That is, the light passes from the first structural layer 101 through the intermediate film layer L0 to the surface (the interface between the second structural layer 102 and the intermediate film layer L0) of the second structural layer 102, and total reflection occurs at the surface.

For example, as illustrated in FIG. 3B, FIG. 8B, and FIG. 17, the intermediate film layer L0 includes an second electrode E2 and an encapsulation layer ECS.

For example, as illustrated in FIG. 8A, the intermediate film layer L0 includes an encapsulation layer ECS.

For example, the refractive index of the intermediate film layer L0 is greater than or equal to the refractive index (first refractive index n1) of the first structural layer 101, but is not limited thereto.

In some embodiments, the refractive index of the intermediate film layer L0 is greater than the refractive index (second refractive index n2) of the second structural layer 102, and the refractive index of the intermediate film layer L0 is greater than or equal to the refractive index (first refractive index n1) of the first structural layer 101.

In the embodiments of the present disclosure, the acrylic material includes an acrylic resin, but is not limited thereto.

At least one embodiment of the present disclosure provides a display device, including any one of the above display panels. For example, the display device may be any product or component having a display function such as a television, a digital camera, a mobile phone, a watch, a tablet computer, a laptop or a navigator including an organic light-emitting diode display device.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be determined by the protection scope of the claims.

What is claimed is:

1. A display panel, comprising:

a base substrate, comprising a plurality of light-emitting regions and a non-light-emitting region located between adjacent ones of the plurality of light-emitting regions;

a pixel-defining layer, located on the base substrate and having a main body part and a plurality of openings defined by the main body part, each of the plurality of openings being configured to define at least one of the plurality of light-emitting regions;

a first structural layer at least located in one of the plurality of light-emitting regions; and a second structural layer at least located in the non-light-emitting region, wherein the first structural layer has a first refractive index, the second structural layer has a second refractive index, and the first refractive index is greater than the second refractive index, wherein the second structural layer is located on the main body part, and the first structural layer is filled in a space defined by the second structural layer, wherein the first structural layer comprises a base layer and filling particles located in the base layer, and wherein a refractive index of the filling particles is greater than a refractive index of the base layer.

2. The display panel according to claim 1, wherein an orthographic projection of the second structural layer on the base substrate falls within an orthographic projection of the main body part on the base substrate.

3. The display panel according to claim 1, wherein a material of the base layer comprises an acrylic material, and a material of the second structural layer comprises an acrylic material, wherein a particle size of the filling particles is at a nanometer level.

4. The display panel according to claim 1, wherein a surface of the first structural layer facing away from the base substrate has a concave-convex structure.

5. The display panel according to claim 1, further comprising an adhesive layer, wherein the adhesive layer covers the first structural layer and covers the second structural layer.

6. The display panel according to claim 5, wherein the adhesive layer is in contact with the first structural layer.

7. The display panel according to claim 1, wherein an area of the first structural layer is not less than an area of the plurality of light-emitting regions, and a side surface of the first structural layer is in contact with a side surface of the second structural layer.

8. The display panel according to claim 7, further comprising a cover plate, wherein the cover plate is in contact with the first structural layer and in contact with the second structural layer.

9. The display panel according to claim 1, wherein the main body part has a groove, and the second structural layer is filled in the groove and protrudes from the main body part.

10. The display panel according to claim 9, further comprising an adhesive layer and a cover plate, wherein the cover plate is bonded to the base substrate through the adhesive layer, and a refractive index of the adhesive layer is greater than the second refractive index.

11. The display panel according to claim 9, wherein a ratio of a maximum dimension of a portion of the second structural layer protruding from the main body part to a maximum thickness of the main body part is greater than or equal to 1:2 and less than or equal to 3:2.

12. A display panel, comprising:

a base substrate, comprising a plurality of light-emitting regions and a non-light-emitting region located between adjacent ones of the plurality of light-emitting regions;

a pixel-defining layer, located on the base substrate and having a main body part and a plurality of openings defined by the main body part, each of the plurality of openings being configured to define at least one of the plurality of light-emitting regions;

a first structural layer at least located in one of the plurality of light-emitting regions; and a second structural layer at least located in the non-light-emitting region, wherein the first structural layer has a first refractive index, the second structural layer has a second refractive index, and the first refractive index is greater than the second refractive index, wherein the first structural layer is located in the plurality of light-emitting regions and located in the non-light-emitting region, the second structural layer is located in the plurality of light-emitting regions and located in the non-light-emitting region, and the first structural layer is closer to the base substrate than the second structural layer.

13. The display panel according to claim 12, further comprising a lens layer, wherein the lens layer is located between the first structural layer and the second structural layer.

14. The display panel according to claim 13, wherein the lens layer comprises a plurality of lens groups, each of the plurality of lens groups comprises a plurality of lens units, and an orthographic projection of the plurality of lens units on the base substrate overlaps an orthographic projection of the opening on the base substrate.

15. The display panel according to claim 1, wherein a side surface of the main body part has a step shape, and the second structural layer covers the side surface and a top surface of the main body part.

16. The display panel according to claim 15, wherein the main body part has a first main body and a second main body, a step is provided between the first main body and the second main body, the first main body is closer to the base substrate than the second main body, and the first structural layer is at least filled in a space defined by the second main body.

17. A display panel, comprising:

a base substrate, comprising a plurality of light-emitting regions and a non-light-emitting region located between adjacent ones of the plurality of light-emitting regions;

a pixel-defining layer, located on the base substrate and having a main body part and a plurality of openings defined by the main body part, each of the plurality of openings being configured to define at least one of the plurality of light-emitting regions;

a first structural layer at least located in one of the plurality of light-emitting regions; and a second structural layer at least located in the non-light-emitting region, wherein the first structural layer has a first refractive index, the second structural layer has a second refractive index, and the first refractive index is greater than the second refractive index, the display panel further comprising an intermediate film layer located between the first structural layer and the second structural layer, wherein a refractive index of the intermediate film layer is greater than the second refractive index and greater than or equal to the first refractive index.

18. A display device, comprising the display panel according to claim 1.

19. The display panel according to claim 17, wherein the first structural layer is located in the plurality of light-emitting regions and located in the non-light-emitting region, the second structural layer is located in the non-light-emitting region, and the second structural layer is closer to the base substrate than the first structural layer.

20. The display panel according to claim 1, further comprising an adhesive layer and a cover plate, wherein the cover plate is bonded to the base substrate through the adhesive layer.

* * * * *